United States Patent
Choi

[11] Patent Number: 5,978,216
[45] Date of Patent: Nov. 2, 1999

[54] SEMICONDUCTOR PACKAGE, LEADFRAME, AND MANUFACTURING METHOD THEREFOR

[75] Inventor: Sin Choi, Chungcheongbuk-do, Rep. of Korea

[73] Assignee: LG Semicon Co., Ltd., Chungcheongbuk-do, Rep. of Korea

[21] Appl. No.: 09/140,101

[22] Filed: Aug. 25, 1998

Related U.S. Application Data

[62] Division of application No. 08/639,649, Apr. 29, 1996.

[30] Foreign Application Priority Data

Apr. 27, 1995 [KR] Rep. of Korea ...................... 95-10042

[51] Int. Cl.$^6$ ..................................................... H05K 7/20
[52] U.S. Cl. ..................... 361/690; 165/80.2; 165/185; 174/16.3; 174/252; 257/675; 257/676; 257/684; 257/692; 257/713; 257/722; 361/707; 361/723; 361/720; 361/813
[58] Field of Search ............................... 165/80.2, 80.3, 165/185; 174/16.3, 252; 257/706–707, 711–713; 721/722, 747, 675; 361/690, 704, 707, 717–722

[56] References Cited

U.S. PATENT DOCUMENTS

| | | | |
|---|---|---|---|
| 4,254,447 | 3/1981 | Grittir | 361/386 |
| 4,677,526 | 6/1987 | Muehling | 361/386 |
| 4,873,615 | 10/1989 | Grabbe | 361/395 |
| 5,214,563 | 5/1993 | Ester | 361/386 |
| 5,291,372 | 3/1994 | Matsumoto | 361/710 |
| 5,786,986 | 7/1998 | Bregman et al. | 361/719 |

*Primary Examiner*—Gregory Thompson
*Attorney, Agent, or Firm*—Loudermilk & Associates

[57] ABSTRACT

A semiconductor package comprises a semiconductor chip having bonding pads in the center area of surface thereof; a plurality of leads disposed on and attached to the upper surface of the chip by an attaching means. The attaching means covers all but the bonding pads of the chip. The leads have a bonding tip which is disposed on the side thereof and electrically connected to the bonding pads by bonding wires, and are arranged horizontally along the surface of the chip thereby providing large contact areas to the chip. A molding compound hermetically encloses the chip and the attaching means, and exposes the leads. The semicoductor package can be used in combination with an electrical circuit board having improved heat dissipation capability. The electrical circuit board includes a substrate comprised of a dielectric material, a circuit wiring formed on the substrate, and a plurality of heat dissipation pins disposed on the substrate in a pattern corresponding to leads of the semiconductor package. The heat dissipation pins electrically connect the leads to the circuit wiring, and in conjunction with air flow in a space between the semiconductor package and the circuit substrate, help to dissipate heat. An improved mold for forming the semiconductor package is also disclosed, which mold is adapted to ensure that molding compound encloses all portions of the semiconductor chip except for portions of the leads.

8 Claims, 3 Drawing Sheets

SEMICONDUCTOR PACKAGE, LEADFRAME, AND MANUFACTURING METHOD THEREFOR

This application is a divisional of copending application (s) application Ser. No. 08/639,649 filed on Apr. 29, 1996.

FIELD OF THE INVENTION

This invention relates to improved packaging for semiconductor chips. In particular, a semiconductor package, and a leadframe for use in the semiconductor package is described, as well as a manufacturing method for forming the semiconductor package and lead frame. The resulting semiconductor package can be used with an electrical circuit board specially adapted for dissipating heat from the semiconductor package.

BACKGROUND OF THE INVENTION

In a conventional semiconductor package, in order to dissipate heat from the device with ease, a heat-exchanging portion is formed by overlaying a molded package with either a heat dissipation panel, or a panel with pins. A panel having heat dissipation pins can also be attached to a leadframe paddle.

A partial sectional view of the latter conventional package described above, is illustrated in FIG. 1. A heat dissipation plate 11 is attached to a back portion of semiconductor chip 10, and molding compound 12 is then used to enclose chip 10 and its signal leads.

In the structure of the conventional semiconductor package manufactured by such method, the heat generated in an upper part of the chip may not be transferred easily to heat dissipation plate 11 through the bottom of the chip. Therefore, in such a structure the heat cannot be dissipated efficiently.

The method in which a molded package is overlaid with either a heat dissipation panel or a panel with pins, is an ineffective heat sink because the heat dissipation plate is attached to the molding compound which typically has a high heat resistance.

SUMMARY OF THE INVENTION

It is an object of the present invention to improve the conventional heat sinking capability of a semiconductor package.

It is another object of the present invention to provide an improved leadframe and manufacturing method therefore.

A further object of the present invention is to provide an improved package for a semiconductor chip that includes the improved leadframe, and a method for making this package.

It is a further object of the present invention to provide an improved electrical circuit board which can be used with the aforementioned improved semiconductor package to enhance heat dissipation from the semiconductor chip.

The leadframe of the present invention has a side rail, a lead linking bar connected to the side rail, a plurality of leads connected to the lead linking bar through thinner cutting portions, and a plurality of bonding tips formed at the side of the leads respectively. The bonding tips are thinner than the leads and the latter are arranged in parallel and connected to the lead linking bars.

The method for manufacturing the leadframe comprises the steps of punching a metal plate on a portion which is later to become the bonding tips, and then forming a leadframe by etching or stamping the metal plate. As indicated above, the portions of the bonding tip are thinner than the leads in thickness. The improved electrical circuit board includes a circuit substrate made of a dielectric material, a circuit wiring formed on the substrate, and a plurality of heat dissipation pins disposed on the substrate in a pattern corresponding to leads of a semiconductor package. The heat dissipation pins are shaped like rectangular rods, are electrically connected to the circuit wiring and function as electric connections and heat dissipators.

When a semiconductor package is mounted on the electrical circuit board, the semiconductor leads transfer heat from the upper face of the semiconductor chip through the heat dissipation pins which are made of a metal having a high heat conductivity.

The semiconductor package includes a semiconductor chip having bonding pads in the center area of a surface thereof, and a plurality of leads disposed on and attached to a upper surface of the chip by an attaching means such as a conventional cured bonding tape. The attaching means does not cover the bonding pads of chip. The leads have a bonding tip disposed at the side thereof and are electrically connected to the bonding pads by bonding wires. The leads are arranged horizontally along the surface of the chip thereby providing large contact areas to the chip, and a molding compound hermetically encloses the chip and the attaching means but leaves the leads exposed.

The mold for forming the semiconductor package has two components. A lower mold has a cavity for holding the semiconductor device; a plurality of lead holes are formed on the bottom of the cavity where the outer leads of a semiconductor package are to be located. A mold cavity gate is formed, through which molding compound can flow to fill said mold cavity after an upper mold is coupled with said lower mold.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENTS

Figure 1:
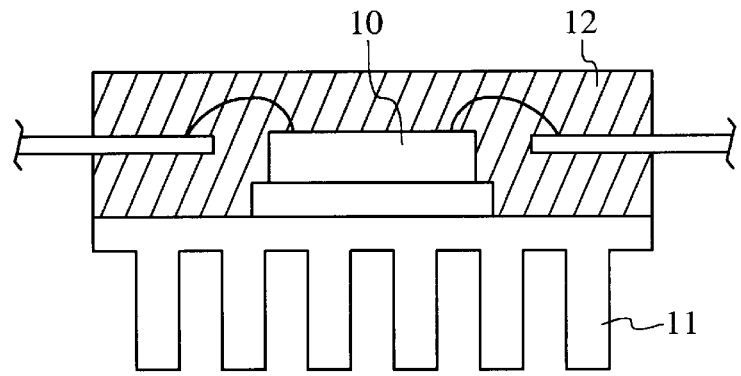
FIG. 1 is a sectional view of a conventional semiconductor package.
Figure 2:
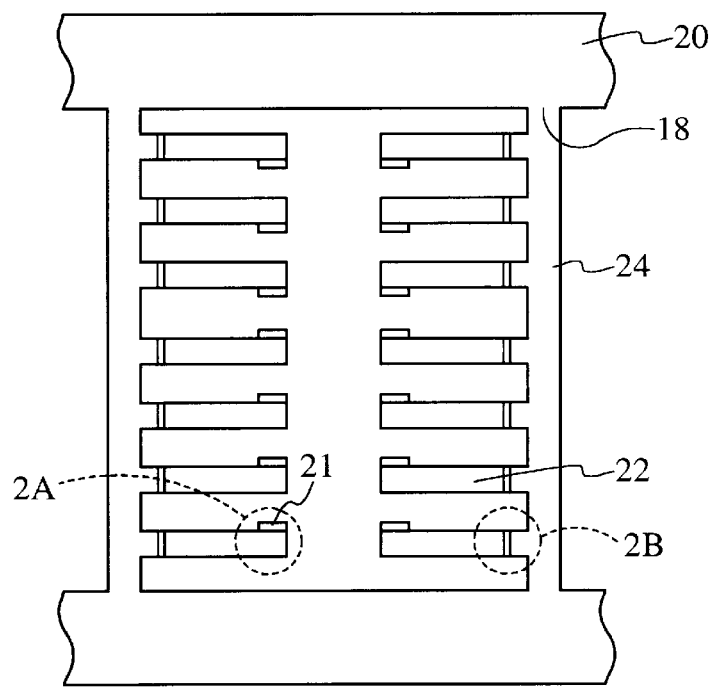
FIG. 2 is a top view of a leadframe of the present invention.
Figure 2A:
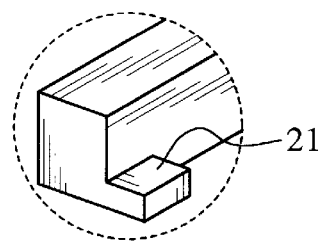
Figure 2B:
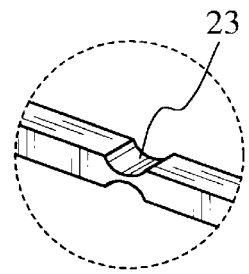

FIG. 2 is a top view of a leadframe of the present invention. Leadframe 18 of the present invention is formed by punching a metal plate such as a leadframe reel plate which for example can be a copper alloy of about 350 μm in thickness.

Figure 3:
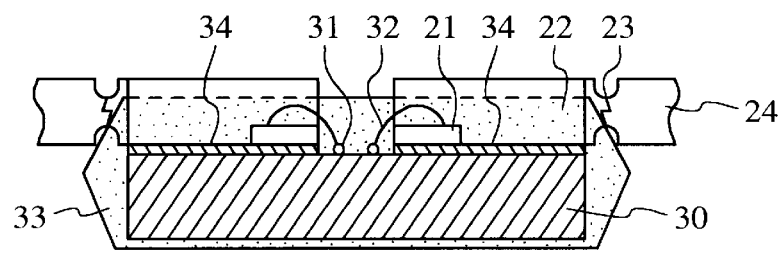
FIG. 3 is a sectional view of a semiconductor package of the present invention.

For manufacturing the leadframe, a plate is first punched in portions designed to be bonding tips 21 in order to make the portion to have a thickness thinner than other portions of leads 22 as illustrated in FIG. 2 and FIG. 3. Thinner cutting portions 23 are formed by simultaneous or independent punching of the plate.

A leadframe pattern is then formed by an etching process or again, by punching the metal plate. This punching process is a conventional technique for manufacturing leadframes.

The leadframe pattern formed from the metal plate has a side rail 20, a lead linking bar 24 connected to side rail 20, a plurality of leads 22 connected to lead linking bar 24 through thinner cutting portion 23, and a plurality of bonding tips 21 formed at one side and at one end of leads 22, as illustrated. Bonding tips 21 are formed to be thinner than the leads.

The semiconductor package according to the present invention as illustrated in FIG. 3 illustrates a small part of sectional view thereof, in which the leadframe described above is joined with chip 30 and enclosed in molding compound 33.

The semiconductor package of the present invention is made in such a way that a leadframe is attached to a chip by using an attaching means such as bonding tape 34 (for example: polyimide tape). The attaching means is cured to complete the bonding process between the chip die and the leadframe leads. Bonding pads 31 on chip 30 are then interconnected respectively with bonding tips 21 by using bonding wires 32. The chip used in these embodiments has the bonding pads in the center areas, but those skilled in the art will appreciate that other locations for the bonding pads can be easily accommodated by the present invention.

Figure 4:
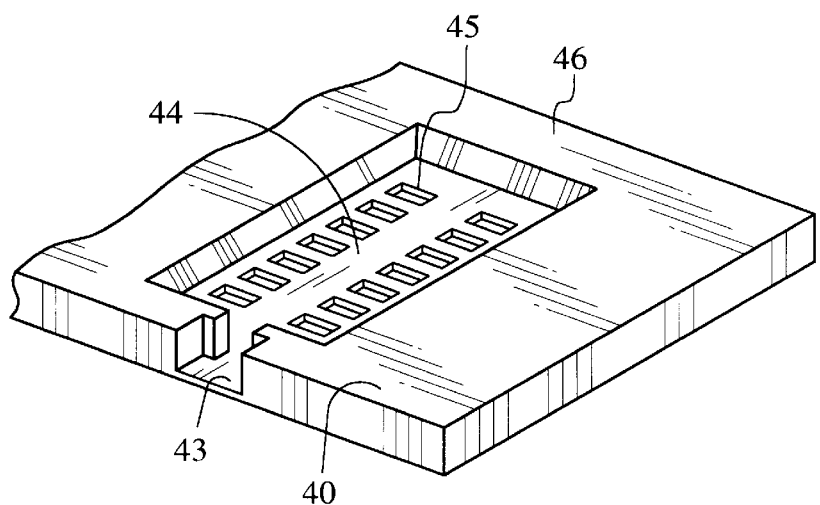
FIG. 4 is a perspective view of a mold used to make the semiconductor package of the present invention.

Thereafter, a package is formed in a mold, as illustrated in FIG. 4, which is designed to expose only a portion of the outside of leads 22 so that these leads are not enveloped by molding compound 33 (i.e., are not completely encapsulated with molding compound 33, but have an upper portion as illustrated).

The mold is illustrated in FIG. 4. A lower part 40 of the mold has a mold cavity 44 which is designed to fit the size of the chip and has a plurality of lead holes 45 for receiving outer leads 22. On the bottom of mold cavity 44, a mold cavity gate 43 is formed through which a molding compound can be used to flow and fill mold cavity 44 after an upper mold (not shown) is joined with the lower mold. Lead holes 45 can be formed by a negative angle discharge process.

A molding process is performed such that a semiconductor package is created from the combined leadframe and semiconductor chip. These structures are arranged in lower mold 40, such that outer leads 22 are inserted in lead holes 45, and an upper mold is then joined and coupled to lower mold 40. A molding compound can then be injected through mold cavity gate 43. After the molding process, thinner cutting portions 23 (which are formed in the leadframe) are cut, thus leaving U-shaped grooves.

Accordingly, in the semiconductor package of the present invention, as illustrated in FIG. 3, only outer leads 22 are exposed and the remainder of the semiconductor chip and leadframe are encapsulated with molding compound 33.

Figure 5:
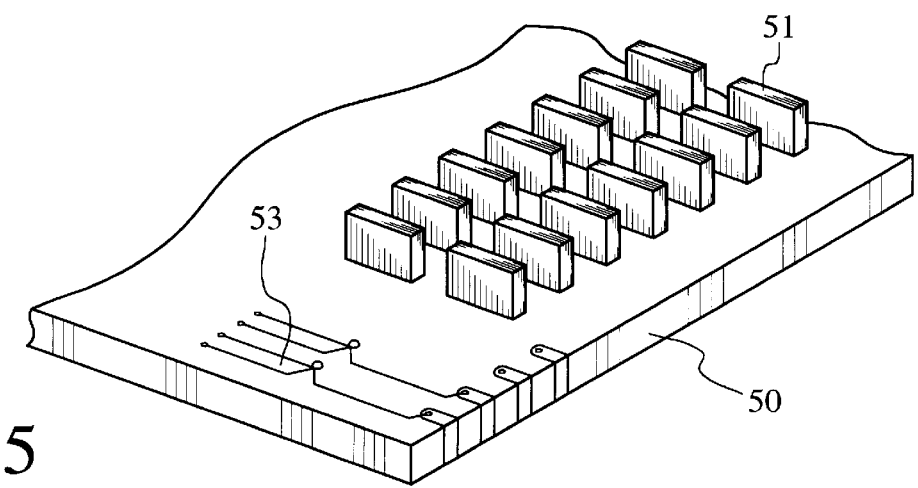
FIG. 5 is a perspective view of a substrate of an electrical circuit of the present invention.
Figure 6:
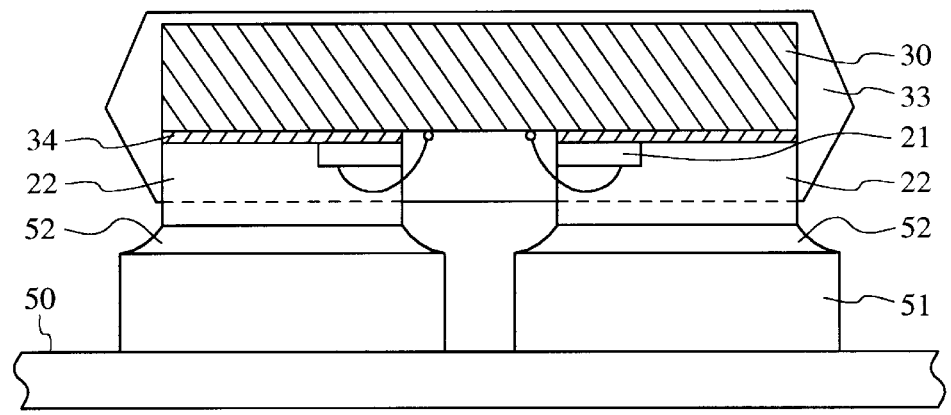
FIG. 6 is a sectional view illustrating a system that includes a semiconductor package of the present invention mounted on an electrical circuit board of the present invention.
Figure 7:
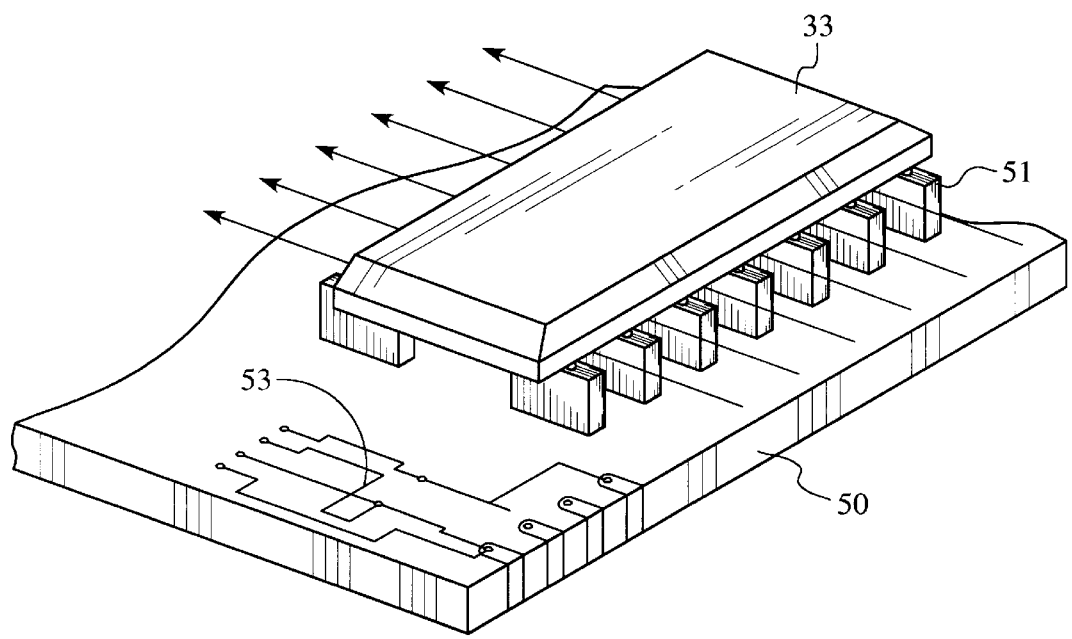
FIG. 7 is a perspective view illustrating a system that includes a semiconductor package of the present invention mounted on an electrical circuit board of the present invention.

FIGS. 5, 6 and 7 are schematic views for illustration of a semiconductor package mounted to an improved PCB board adapted for use with the present invention. FIG. 5 is a perspective view of a substrate portion of the printed circuit board, FIG. 6 is a partial sectional view illustrating the semiconductor package mounted to the printed circuit board, and FIG. 7 is a perspective view illustrating how the semiconductor package is surface mounted to the substrate 50 of the PCB.

The electrical circuit board of the present invention, as illustrated in FIG. 5, has a substrate 50 which is made of dielectric material, electric circuit wiring 53 formed on or in the substrate, and a plurality of heat dissipation pins 51 disposed on the substrate. Heat dissipation pins 51 are also used for electrically connecting outer leads 22 of the semiconductor package to electric circuit wiring 53. The pins 51 have a height of about 2 to 3 mm above a surface of substrate 50.

Heat dissipation pins 51 can be formed in a manner that is used for any typical conductivity layer. For example, Ni—Pb layer can be formed by sputtering, CVD(Chemical Vapor Deposition) or plating on the substrate. A lithographic process is then carried out to form pins 51 in those places where the conductivity layer is partially etched, thus forming pins 51.

Another method of making heat dissipation pins would be to form a photoresist mask pattern on substrate 50 which is then patterned to have openings where the pins are to be connected to the leads of the semiconductor package. Then a metal or other conductive layer of predetermined thickness is formed by sputtering or plating. When the photoresist is removed, the pins are formed.

To surface mount the semiconductor package of the present invention to printed circuit board of the present invention as described above, solder paste is first plated in lead connecting portions of heat dissipation pins 51 on the PCB, and/or is applied to outer leads 22 of the package. The package is then positioned on a predetermined position on substrate 50, and then outer leads 22 are connected to heat dissipation pins 51 when the solder paste is heated to melt.

According to the above embodiments, effective heat sinking can be realized since the heat generated from a semiconductor chip inside the package is transferred through metal of the heat dissipation pins to the ambient air.

That is, since heat transfer is performed directly from the upper surface of the chip (which is the primary source of heat) to the heat dissipation pins, the heat transfer is efficiently accomplished and operating failures due to exceeding heat limitations are prevented.

Because a conventional trimming and forming process of the outer leads is unnecessary, the manufacturing process for the package is also simplified.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A heat dissipating device for use with an integrated circuit package located on a printed circuit board, said printed circuit board including a dielectric substrate and circuit wiring, said device comprising;
   a plurality of rectangular rod shaped pins disposed on said substrate in a pattern corresponding to signal leads of said integrated circuit package;
   wherein the pins electrically connect the leads and said circuit wiring and operate to dissipate heat away from said integrated circuit package.

2. The device of claim 1, wherein the pins have a height of about 2 to 3 mm above a surface of said substrate.

3. A system for removing heat from a semiconductor package mounted on an electrical circuit board, said circuit board including a substrate and circuit wiring formed on and/or in said substrate, said system comprising;

a plurality of rectangular rod shaped heat dissipation pins disposed on said circuit board substrate, the pins being arranged in a pattern corresponding to leads of said semiconductor package and being electrically connected to said circuit wiring; said semiconductor package further comprising:
(i) a semiconductor chip having bonding pads on a surface thereof;
(ii) a plurality of leads disposed on said chip;
(iii) attaching means for attaching the leads to the chip, wherein the attaching means does not cover said bonding pads of the chip;
(iv) the leads each having a bonding tip which is disposed on the side thereof and electrically connected to said bonding pads by bonding wires, and wherein the leads are arranged horizontally along the surface of said chip thereby providing large contact areas to said chip;
(v) a molding compound hermetically enclosing the chip and exposing the leads; and
wherein the semiconductor package is mounted on the pins such that the leads of the semiconductor package are electrically connected and attached to said pins; and
whereby ambient air flows in a space between said semiconductor package and said circuit substrate.

4. The system of claim 3, wherein the leads are located such that heat generated in the top surface of said chip can be transferred efficiently to the leads and can be dissipated by the pins on said circuit substrate.

5. The system of claim 3, wherein heat is removed from the semiconductor package by a combination of ambient air flow passing over said semiconductor package and by the heat dissipation pins.

6. The system of claim 3, wherein the bonding tips are thinner than the leads and are located along a side edge of the leads.

7. The system of claim 3, wherein the pins are attached with solder to the leads of the semiconductor package.

8. The system of claim 3, wherein the pins are made of a deposited and etched Ni—P alloy.

* * * * *

UNITED STATES PATENT AND TRADEMARK OFFICE
CERTIFICATE OF CORRECTION

PATENT NO : 5,978,216
DATED : 11/02/99
INVENTOR(S) : SIN CHOI

It is certified that following error appears in the above-identified patent and that said Letters Patent is hereby corrected as shown below:

Column 1, Line 49, delete "therefore" and insert --therefor--.

Signed and Sealed this

Eighth Day of May, 2001

*Attest:*

NICHOLAS P. GODICI

*Attesting Officer*   *Acting Director of the United States Patent and Trademark Office*